US012690487B2

(12) United States Patent
Woodyard et al.

(10) Patent No.: US 12,690,487 B2
(45) Date of Patent: Jul. 21, 2026

(54) EMBEDDING AN ELECTRONIC COMPONENT IN A CORE OF AN INTEGRATED CIRCUIT SUBSTRATE

(71) Applicant: Microsoft Technology Licensing, LLC, Redmond, WA (US)

(72) Inventors: Jon Thomas Woodyard, Livermore, CA (US); Rahul Agarwal, Livermore, CA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 419 days.

(21) Appl. No.: 18/333,184

(22) Filed: Jun. 12, 2023

(65) Prior Publication Data

US 2024/0413029 A1    Dec. 12, 2024

(51) Int. Cl.
| | |
|---|---|
| *H01L 23/31* | (2006.01) |
| *H01L 23/14* | (2006.01) |
| *H01L 23/498* | (2006.01) |
| *H01L 25/16* | (2023.01) |
| *H10W 70/63* | (2026.01) |
| *H10W 70/68* | (2026.01) |
| *H10W 74/10* | (2026.01) |
| *H10W 90/00* | (2026.01) |
| *H10D 1/68* | (2025.01) |

(52) U.S. Cl.
CPC ........ *H10W 74/114* (2026.01); *H10W 70/635* (2026.01); *H10W 70/6875* (2026.01); *H10W 90/00* (2026.01); *H10D 1/68* (2025.01)

(58) Field of Classification Search
CPC ............... H01L 23/3121; H01L 23/142; H01L 23/49827; H01L 25/16; H10D 1/68; H10W 74/114; H10W 90/00; H10W 70/635; H10W 70/6875
See application file for complete search history.

(56) References Cited

U.S. PATENT DOCUMENTS

| | | | | |
|---|---|---|---|---|
| 2007/0281394 A1* | 12/2007 | Kawabe | ................... | H01L 23/50 |
| | | | | 438/118 |
| 2011/0210438 A1 | 9/2011 | Sweeney | | |
| 2015/0043183 A1* | 2/2015 | Ishiguro | ................. | H05K 1/185 |
| | | | | 174/251 |

(Continued)

OTHER PUBLICATIONS

International Search Report and Written Opinion received for PCT Application No. PCT/US2024/032330, Sep. 11, 2024, 12 pages.

*Primary Examiner* — Peniel M Gumedzoe
(74) *Attorney, Agent, or Firm* — Alleman Hall LLP

(57) ABSTRACT
Examples are provided that relate to embedding, in a core of a substrate, an electronic component having a thickness less than a thickness of the core. One example provides an electronic device comprising a substrate comprising a core and one or more buildup layers coupled with the core, each buildup layer comprising a metal layer and a dielectric layer. The core comprises a center comprising a plurality of plies, and an additional layer comprising one or more additional plies. The electronic device further comprises an electronic component embedded in at least one of the center or the additional layer of the core. The electronic component comprises a thickness less than a thickness of the core. The electronic device further comprises an integrated circuit die coupled with the substrate and electrically connected to the electronic component.

17 Claims, 6 Drawing Sheets

100

(56)                    References Cited

U.S. PATENT DOCUMENTS

2016/0293581  A1*   10/2016  Lin  .................. H01L 23/49811
2021/0068261  A1     3/2021  Cho
2021/0159200  A1*    5/2021  Lee  .................. H01L 23/49838
2021/0375736  A1    12/2021  Buot

* cited by examiner

500

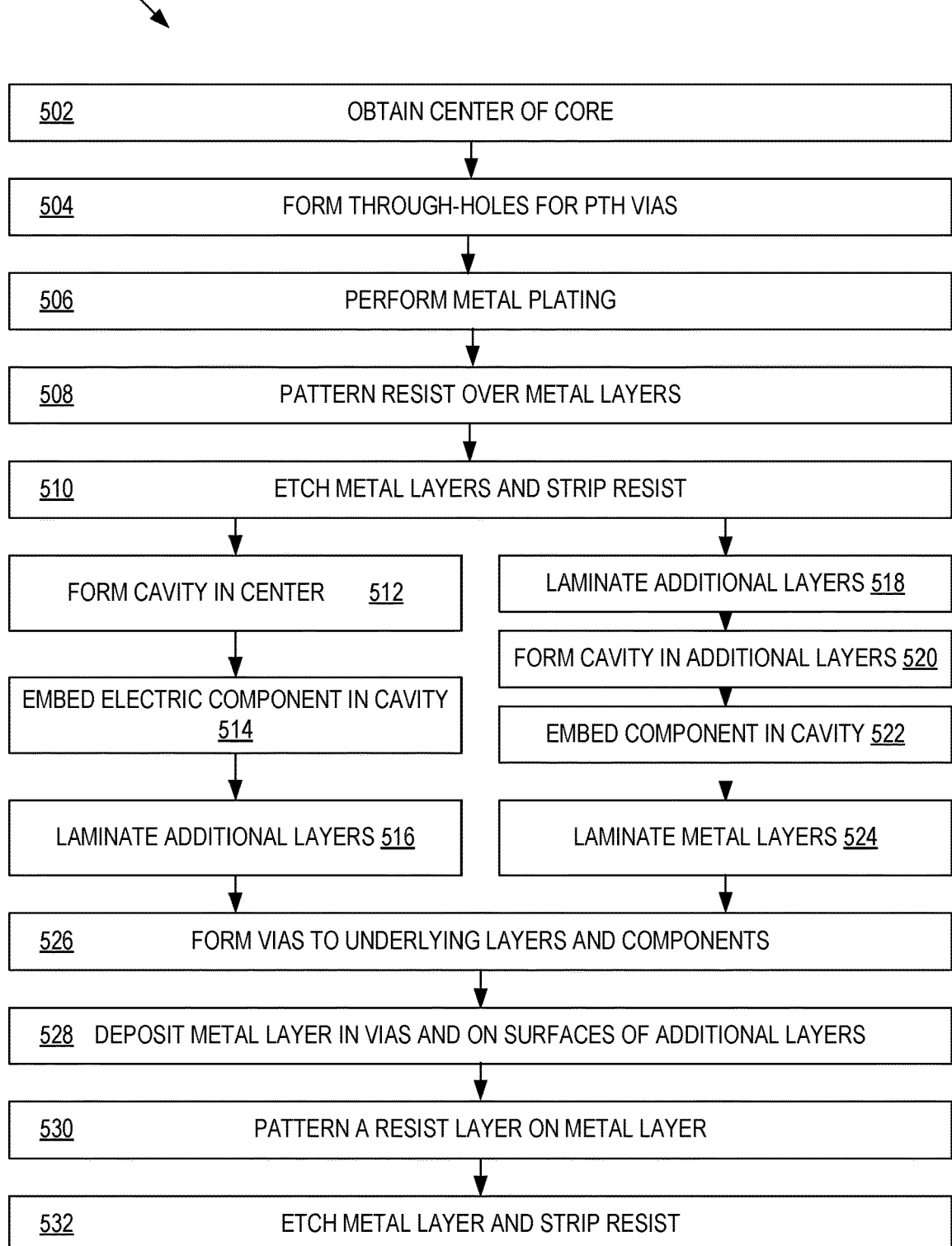

| 502 | OBTAIN CENTER OF CORE |

| 504 | FORM THROUGH-HOLES FOR PTH VIAS |

| 506 | PERFORM METAL PLATING |

| 508 | PATTERN RESIST OVER METAL LAYERS |

| 510 | ETCH METAL LAYERS AND STRIP RESIST |

FORM CAVITY IN CENTER    512

EMBED ELECTRIC COMPONENT IN CAVITY 514

LAMINATE ADDITIONAL LAYERS 516

LAMINATE ADDITIONAL LAYERS 518

FORM CAVITY IN ADDITIONAL LAYERS 520

EMBED COMPONENT IN CAVITY 522

LAMINATE METAL LAYERS 524

| 526 | FORM VIAS TO UNDERLYING LAYERS AND COMPONENTS |

| 528 | DEPOSIT METAL LAYER IN VIAS AND ON SURFACES OF ADDITIONAL LAYERS |

| 530 | PATTERN A RESIST LAYER ON METAL LAYER |

| 532 | ETCH METAL LAYER AND STRIP RESIST |

FIG. 5

600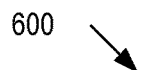

602 ——— OBTAIN A CENTER AND AN ADDITIONAL LAYER FOR A CORE OF A SUBSTRATE

604 ——— OBTAIN A SECOND ADDITIONAL LAYER FOR THE CORE

606 ——— FORM A CAVITY FOR AN ELECTRONIC COMPONENT

608 ——— FORM THE CAVITY IN THE CENTER OF THE CORE

610 ——— FORM THE CAVITY IN THE ADDITIONAL LAYER OF THE CORE

612 ——— FORM AN ADDITIONAL CAVITY IN THE SECOND ADDITIONAL LAYER

614 ——— PLACE THE ELECTRONIC COMPONENT IN THE CAVITY

616 ——— PLACE AN ADDITIONAL COMPONENT IN THE ADDITIONAL CAVITY OF THE SECOND ADDITIONAL LAYER

618 ——— AFFIX THE CENTER AND THE ADDITIONAL LAYER TOGETHER

620 ——— AFFIX THE SECOND ADDITIONAL LAYER TO THE CORE

622 ——— AFFIX ONE OR MORE BUILDUP LAYERS TO THE CORE

FIG. 6

EMBEDDING AN ELECTRONIC COMPONENT IN A CORE OF AN INTEGRATED CIRCUIT SUBSTRATE

BACKGROUND

Many electronic devices comprise an integrated circuit (IC) die mounted on a substrate along with other electronic components. Such substrates are designed with a specific mechanical rigidity to reach desired defect densities and yields during manufacturing. Higher yields reduces a manufacturing cost per part.

Other components that can be mounted to a substrate include capacitors configured to provide power to the IC die for power integrity. Such capacitors can be positioned adjacent to the IC die and/or across a thickness of the substrate from the IC die. Insufficient power integrity may change an operating point of the IC die, such as lowering an operating frequency.

SUMMARY

Examples are provided that relate to embedding, in a core of a substrate, an electronic component having a thickness less than a thickness of the core. One example provides an electronic device comprising a substrate comprising a core and one or more buildup layers coupled with the core. Each buildup layer comprises a metal layer and a dielectric layer. The core comprises a center comprising a plurality of plies, and an additional layer comprising one or more additional plies. The electronic device further comprises an electronic component embedded in at least one of the center or the additional layer of the core. The electronic component comprises a thickness less than a thickness of the core. The electronic device further comprises an integrated circuit die coupled with the substrate and electrically connected to the electronic component.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

BRIEF DESCRIPTION OF THE DRAWINGS

FIG. 5 illustrates a flow diagram illustrating an example manufacturing method for a core of a substrate.

FIG. 6 illustrates a flow diagram of an example method for embedding an electronic component in a core of a substrate.

DETAILED DESCRIPTION

Figure 1:
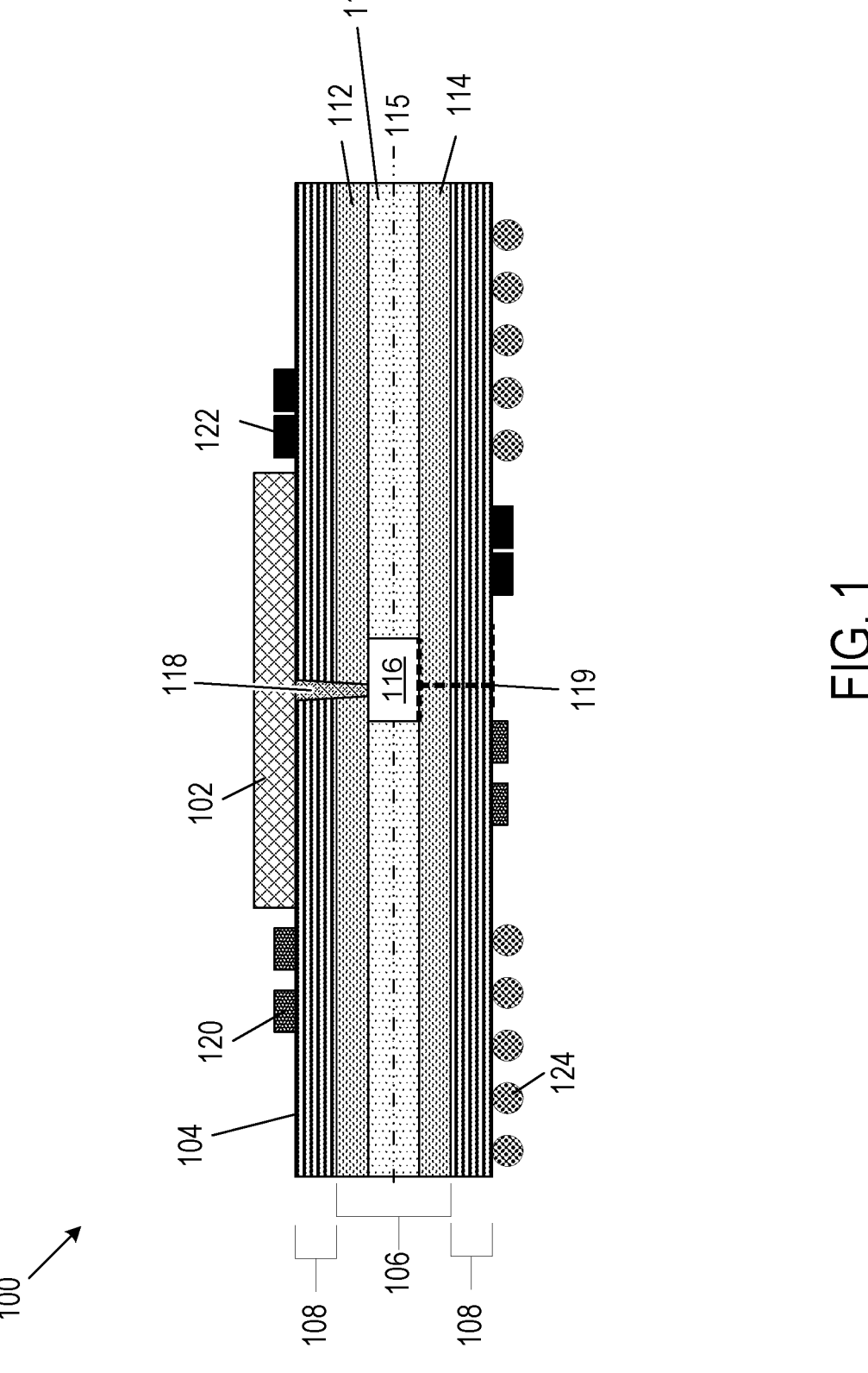
FIG. 1 schematically depicts an example electronic device utilizing a substrate core having a thickness greater than a thickness of an electronic component embedded in the core.

As mentioned above, an electronic device can comprise an integrated circuit (IC) die and other electronic components mounted onto a substrate. An integrated circuit substrate comprises a core formed from composite plies, and buildup layers located on one or both sides of the core. The core provides mechanical rigidity to the substrate. Each ply of the core comprises a woven glass material impregnated with a cured resin. The buildup layers include metal layers separated by dielectric layers. The dielectric layers comprise a polymer that is cured and selected for creating fine conductor lines and spaces therein. However, such polymers have low modulus, and thus do not provide mechanical rigidity to the substrate. The metal layers are used to electrically connect an integrated circuit die mounted on the substrate with other components also mounted on the substrate. Examples of such components include capacitors for power integrity.

In some devices, the capacitors for power integrity can be mounted to a same side of a substrate as an IC die. However, as IC dies become larger, the capacitors are mounted laterally farther from a center of the IC die. This can impact power delivery from the capacitor to the IC die, where power is delivered to a center of an IC die. As one possible solution, capacitors for power integrity can be mounted to an opposite side of the substrate as the IC die. In this manner, power from the capacitor travels through a thickness of the substrate, rather than along a plane of the substrate, to reach the IC die. This can avoid problems with increasing lateral distances. However, the core of such substrates also is being made to be thicker to provide for additional mechanical rigidity compared to substrates with thinner cores. Increasing thickness of the core also poses the problem of moving the capacitors farther from the IC die.

As another method of addressing the issues above, a capacitor can be incorporated into a core of a substrate. This shortens the distance between the capacitor and the IC die on the substrate. However, embedding a capacitor into the core of the substrate weakens the substrate, and can reduce support provided by the core to the buildup layers and IC die. Designing the core to be the same thickness as the capacitor embedded in the core helps with manufacturing of a substrate with an embedded capacitor. For example, if the core is too thick compared to the embedded capacitor, dimple formation can occur in metal layers of due to the opening in the core in which the embedded capacitor is placed. Adding additional resin to fill space not occupied by the embedded capacitor may not provide sufficient structural support for reliability. Thus, the thickness of the core can be limited to the same thickness of the capacitor. As specific examples, capacitors manufactured on a 6-inch silicon wafer are around 600 microns thick, on an 8-inch silicon wafer are around 700 microns thick, and on a 12-inch silicon wafer are around 780 microns thick. Thus, using current technologies, this limits the core thicknesses to these specific values or thinner.

Accordingly, examples are disclosed that relate to embedding an electronic component in a core of a substrate in a manner that allows the electronic component to have a thickness less than a thickness of the core. Briefly, an electronic device comprises an IC mounted to a substrate with a core and buildup layer(s). The buildup layer(s) are configured to provide conductor lines for electrical connections. The core comprises a center and one or more additional layers. The center and the one or more additional layers can comprise composite dielectric layers formed from a material or materials configured to promote rigidity of the substrate and/or to act as a carrier to support the buildup layer(s). The electronic device further comprises an electronic component embedded in the core. In some examples, the electronic component can be embedded in the center of the core. Alternatively or additionally, the electronic component can be embedded in an additional layer of the core. Each additional layer comprises one or more rigid ply layers. The use of the additional layer for the core allows the electronic component to have a thickness less than a thickness of the core, thereby allowing the formation of thicker and more rigid substrates.

FIG. 1 schematically depicts an example electronic device 100. Electronic device 100 can be configured for any suitable use. Examples include high performance computing, such as center processing units, artificial intelligence, cloud gaming, data centers, and servers. Electronic device 100 comprises an IC die 102 coupled to a substrate 104. Substrate 104 comprises a core 106 and a plurality of buildup layers 108 coupled with core 106. Each layer of the plurality of buildup layers 108 comprises a metal layer (e.g., copper or another conductor) and a dielectric layer (e.g., a polymer that is cured). One or more of the metal layers can be patterned to form various electrical connections. Further, different metal layers can be electrically connected using vias through the dielectric layers (omitted for clarity). The dielectric layers can be selected depending on desired electrical performance.

Core 106 comprises a center 110, a first additional layer 112, and a second additional layer 114. First and second additional layers 112, 114 are coupled to center 110 on opposite sides to help stiffen and balance substrate 104 (e.g., thermal expansion thereof) around a neutral axis 115 of substrate 104. Balancing substrate 104 helps to reduce warpage and/or coplanarity of substrate 104 during manufacturing. Further, first and second additional layers 112, 114 add additional core material further from the neutral axis 115. Such a configuration helps to stiffen core 106 about the neutral axis 115.

Electronic device 100 further comprises an electronic component 116. In the depicted example, electronic component 116 is embedded in center 110, as will be discussed in more detail with reference to FIG. 2. Alternatively or additionally, electronic component 116 can be embedded in first additional layer 112 or second additional layer 114, as discussed with reference to FIGS. 3 and 4. As the core is formed from center 110 and additional layer 112, 114, electronic component 116 comprises a thickness less than a thickness of core 106. Thus, electronic component 116 can comprise a full silicon wafer thickness (e.g., 600 microns, 700 microns, or 780 microns) or less, while core 106 comprises a desired thickness for mechanical stability (e.g., within a range of 1.0 mm-1.6 mm, in some examples). Further, in such a manner, the thickness of electronic component 116 can be indifferent to the full silicon wafer thickness.

Electronic component 116 is electrically connected to IC die 102. The connection between electronic component 116 and IC die 102 is schematically depicted here as a single via 118 for clarity. However, a plurality of vias between various metal layers in substrate 104 can be used to provide an electrical connection between electronic component 116 and IC die 102. Electronic component 116 can comprise any suitable component. In some examples, electronic component 116 comprises a multilayer ceramic component (MLCC), a capacitive array, a semiconductor device (e.g., an integrated active device and/or a passive device), an interposer, and/or another electronic component. In some examples in which electrical component 116 is an active semiconductor device, thermal vias can be used to thermally couple the active silicon to a surface of substrate 104 to provide a conductive thermal path for cooling. An optional thermal via is depicted schematically at 119. Optional thermal via 119 leads to a heat dissipation structure, indicated schematically at 120. Optional thermal via 119 and heat dissipation structure 120 schematically represent any suitable structures for removing heat from electronic component. In other examples, a silicon thermal path (not shown) alternatively or additionally can be embedded in core 106. Further, the silicon path can be thermally coupled to IC die 102 and a surface of substrate 108 using thermal vias. This can provide a path to remove heat from IC die 102.

Electronic device 100 further comprises a plurality of passive components 120 and a plurality of integrated passive devices (IPDs) 122. Here, some of the plurality of passive components 120 and some of the plurality of IPDs 122 are coupled to substrate 104 on a same-side as IC die 102 (e.g., die-side). A remainder of the plurality of passive components 120 and a remainder of the plurality of IPDs 122 are coupled to substrate 104 opposite of IC die 102 (e.g., land-side). The plurality of passive components 120 can comprise surface-mount devices or other suitable devices. The plurality of IPDs 122 can comprise resistors, capacitors, and/or inductors. IPDs also can be referred to as integrated passive components or integrated passive networks (IPNs). Electronic device 100 further comprises a ball grid array 124 coupled to the land-side of substrate 104. Ball grid array 124 comprises an array of solder balls configured to electrically connect substrate 104 to a motherboard, another electric device, an additional IC die, or another electronic component. Alternatively, in other examples, electronic device 100 can comprise a land grid array (LGA) that is configured to be socketed into a socket, such as a socket mounted to a motherboard, for example. FIG. 1 is illustrative. In other examples, electronic device 100 can comprise other components not shown and/or omit one or more components shown.

Figure 2:
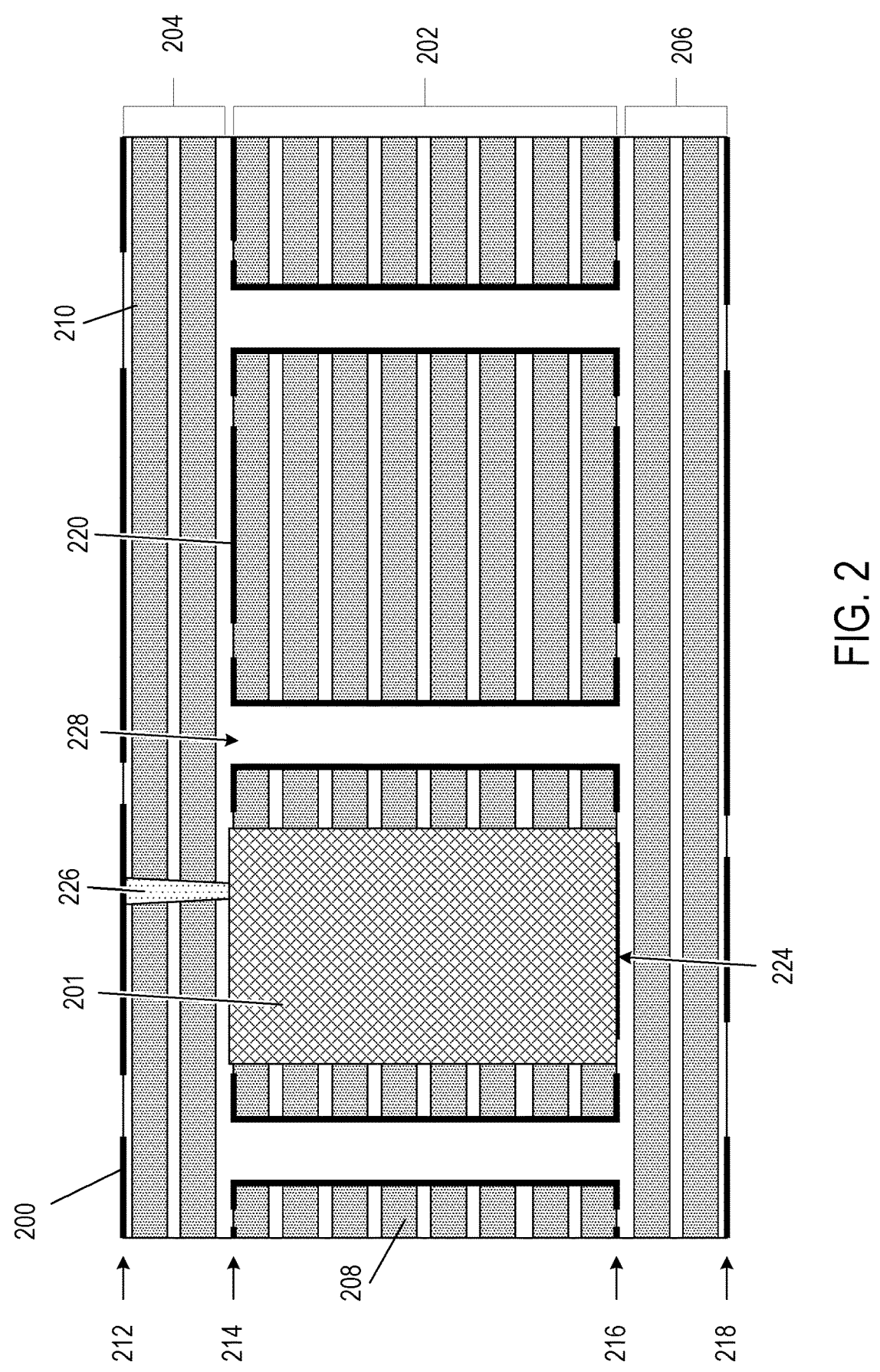
FIG. 2 schematically depicts an example core with an electronic component embedded in a center of the core.

FIG. 2 schematically depicts an example core 200 having a thickness greater than a thickness of an electronic component 201. Core 200 is an example of core 106. Core 200 comprises a center 202 and a first additional layer 204 coupled to center 202. Further, core 200 comprises a second additional layer 206 coupled to center 202 on an opposite side than first additional layer 204.

Center 202 comprises a plurality of plies 208. Each ply 208 can comprise a woven glass layer in a resin matrix, such as a woven glass material impregnated with a resin, for example. In some examples, each ply 208 can comprise a thickness of 100 microns. In other examples, each ply can be made of another suitable material and/or have other thickness. In further examples, center 202 may comprise a homogenous glass configured to be rigid and high modulus. In such examples, center 202 can comprise the plurality of plies 208 or omit the plurality of plies 208. In the decided example, the plurality of plies 208 is depicted as having 8 plies. The thickness of center 202 can be around 0.8 mm or less in some examples. In other examples any other suitable number of plies can be used to form a center having any suitable thickness.

Each of first additional layer 204 and second additional layer 206 comprises a plurality of additional plies 210. In some examples, each additional ply 210 is formed from a prepreg layer. A prepreg layer is a composite material comprising fibers pre-impregnated with a partially cured polymer matrix. In other examples, each additional ply 210 can be formed from any other suitable material that provides additional structural rigidity to the core. While first additional layer 204 and second additional layer 206 are depicted here as having two additional plies 210, in other examples any suitable number of additional plies can be used (e.g., one additional ply or more than two additional plies). The number of additional plies maybe selected based on desired cost, thickness, and/or stiffness/warpage. In other examples, other materials than a prepreg layer can be used to form each ply. For example, fiber cloth and uncured resin can be combined to form each ply in a lay-up process.

Core 200 further comprises a metal layer-1 212, a metal layer-2 214, a metal layer-3 216, and a metal layer-4 218. As depicted, metal layer-1 212 is coupled to a side of first additional layer 204 opposite of center 202. Here, metal layer-1 212 has been patterned. The patterning can form electrical connections or another structure. Similarly, metal layer-4 218 is coupled to second additional layer 206 opposite of center 202. Additionally, metal layer-2 214 is coupled between first additional layer 204 and center 202. Here, metal layer-2 comprises patterning in the form of capture pads 220. Capture pads 220 are utilized for alignment in various manufacturing steps, as discussed with reference to FIG. 5. Similarly, metal layer-3 216 is coupled between center 202 and second additional layer 206.

In the depicted example of FIG. 2, electronic component 201 is embedded in center 202. Electronic component 201 is an example of electronic component 116. As can be seen, electronic component 201 comprises a thickness less than a thickness of core 200. As a specific example, electronic component 201 and therefore center 202 can comprise a thickness of 780 microns or less, corresponding to a thickness of a 12-inch silicon wafer. Core 200 can comprise an overall thickness of 1.0 mm-1.6 mm in some examples, depending upon a number of plies used to form each additional layer 204, 206. The additional thickness provided by additional layers 204, 206 help to provide mechanical stability to core 200, and therefore a substrate utilizing core 200. The plies of first and second additional layers 204, 206 are unbroken by electronic component 201, and therefore mechanically reinforce core 200. In other examples, electronic component 201 and center 202 can comprise a thickness of 650 mm, corresponding to a 6-inch silicon wafer.

As shown, electronic component 201 is aligned with one of the capture pads 220, as indicated at 224. Further, electronic component 201 is electrically connected to metal layer-1 212 using a via 226 through first additional layer 204. In examples where electronic component comprises a silicon component, the silicon component can be thermally coupled to a die-side and a land-side of a substrate using thermal vias. In further examples, core 200 can have one or more additional electric components embedded in center 202. In yet further examples, core 200 can have one or more other electric components embedded in first additional layer 204 and/or second additional layer 206, as discussed below. Core 200 further comprises a plurality of plating through hole (PTH) vias 228. The plurality of PTH vias 228 carry electrical current, such as for a power plane. FIG. 2 is illustrative. In other examples, a core can have another configuration.

Figure 3:
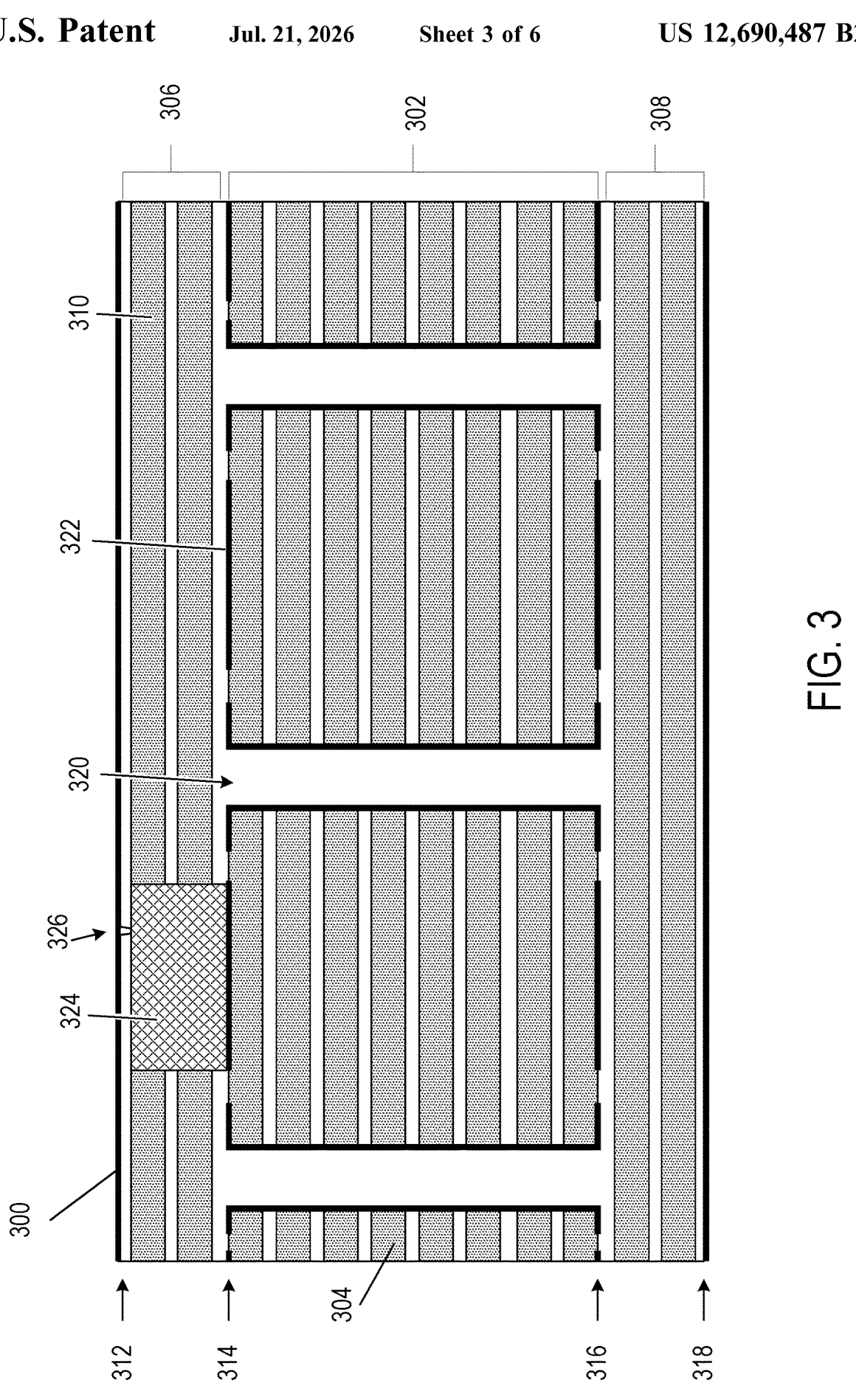
FIG. 3 schematically depicts an example core with an electronic component embedded in an additional layer of the core.

In other examples, a substrate can have an electronic component embedded in an additional layer of the core. FIG. 3 schematically depicts such an example core 300. Core 300 can be used in substrate 104 as an alternative to core 106. Similar to core 200, core 300 comprises a center 302 comprising a plurality of plies 304. Further, core 300 comprises a first additional layer 306 and a second additional layer 308, each comprising a plurality of additional plies 310. While depicted with two additional plies 310, first and/or second additional layer 306, 308 can each comprise any suitable number of additional plies 310 in other examples, including a single ply or more than two plies. Additionally, core 300 also comprises a metal layer-1 312, a metal layer-2 314, a metal layer-3 316, a metal layer-4 318, and a plurality of PTH vias 320. As can be seen, metal layer-2 314 and metal layer-3 316 comprise a patterning in the form of a plurality of capture pads 322.

Core 300 further comprises an electronic component 324 embedded in first additional layer 306. Electronic component 324 is an example of electronic component 116. Here, center 302 is unbroken by an embedded component and therefore provides mechanical rigidity to core 300. Electronic component 324 is aligned with one of the capture pads 322 of metal layer-2 314. Further locating electronic component 324 within first additional layer 306 positions the electronic component 324 closer to an IC die coupled to a substrate comprising core 300 than conventional placements. This allows core 300 to comprise a thickness larger than current silicon wafer thicknesses without impacting power integrity or mechanical rigidity of a substrate using core 300.

Figure 4:
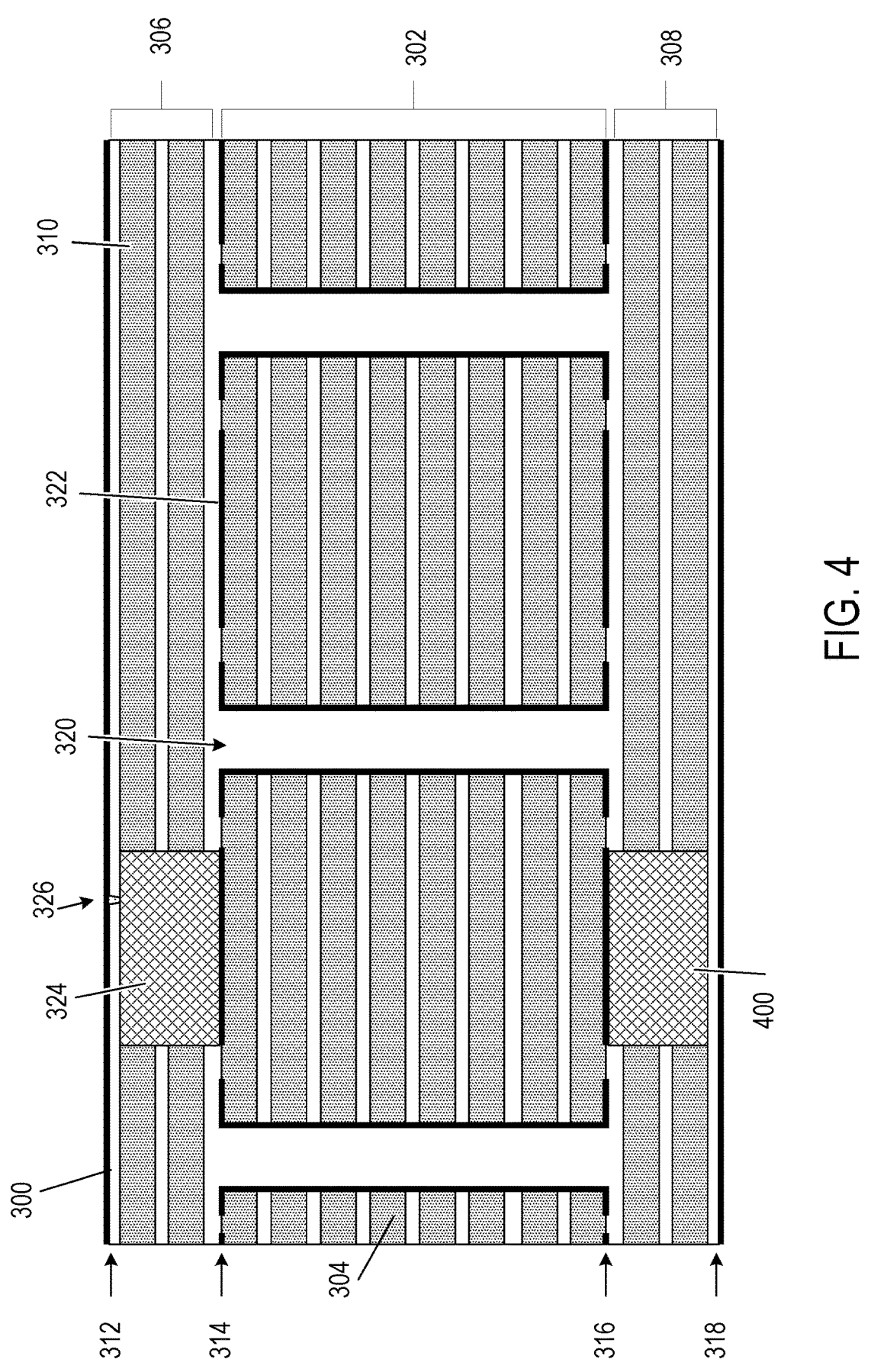
FIG. 4 schematically depicts the core of FIG. 3 with an additional component.

Electronic component 324 is connected to metal layer-1 312 using a via 326. In some examples, an additional component 400 can be embedded in second additional layer 308, as schematically depicted in FIG. 4. Additional component 400 can comprise an additional electronic component. The additional electronic component can be a same type as electronic component 324 or a different type. Alternatively, additional component 400 can comprise a dummy component. The dummy component can comprise silicon or another material. The dummy component helps to balance core 300, such as the thermal expansion of core 300. A balanced core as disclosed can help to reduce warping compared to an unbalanced core therefore can help to reduce problems arising from such warping during manufacturing of the substrate and/or package assembly of the substrate. Electronic component 324 is closer to the IC die on the substrate than electronic component 201. FIGS. 3 and 4 are illustrative. In other examples, core 300 can use another configuration. In further examples, any suitable combination of FIGS. 2, 3, and 4 can be used as a core of a substrate.

A center for a core according to the present disclosure can be manufactured using current core manufacturing techniques. With a potentially small number of additional processing steps, additional layers are coupled to the center and a component is embedded. FIG. 5 illustrates a flow diagram of an example method 500 for manufacturing such a core of a substrate. Method 500 can be used to manufacture core 106, core 200, and/or core 300, for example. Method 500 comprises obtaining, at 502, a center of a core for a substrate. At 504, method 500 comprises forming holes to form plated through-hole (PTH) vias. After forming the holes, method 500 comprises, at 506, performing a metal plating process to form the PTH vias and also plate the surface of the center of the core with metal. Next, method 500 forms, at 508, performing a resist patterning process to create patterning for etching metal layers. Method 500 further comprises, at 510 etching metal that is not covered by the pattern, and then stripping the patterned resist. This patterns the metal layers (e.g. metal layer-2, metal layer-3 in FIGS. 2 and 3 above), on the core center.

In examples where an electronic component is embedded in the center of the core, method 500 comprises forming, at 512, a cavity for the electronic component in the center of the core. When the patterning of the metal layers comprises capture pads, the capture pads can be imaged to aid alignment of the cavities across a surface of the center of the core. After forming the cavities, method 500 comprises embedding, at 514, the electronic components into the cavities in the center of the core. This can be performed, for example, using a pick and place process. At 516, method 500 comprises laminating a first additional layer and a second additional layer of the core to the center for additional metal layers (e.g., metal layer-1 and metal layer-4 above). The first and the second additional layers are laminated onto opposite sides of the center. In some examples, the first and second additional layers comprise layers of prepreg fiber with a B-staged polymer matrix. In other examples, either first or second additional layer can be omitted. In some examples, the first and second additional layers can be laminated to the center during different pressings.

In examples where an electronic component is embedded in an additional layer of the core, method 500 proceeds from 510 to 518. At 518, method 500 comprises laminating the additional layers to the center. Each additional layer can comprise, for example, prepreg material configured at an advanced B stage or at a C stage (no flow prepreg). Such a configuration can help to prevent bleeding of the prepreg when forming a cavity. Method 500 further comprises forming, at 520, the cavity for the electronic component in one of the additional layers. Optionally, method 500 can also form an additional cavity for an additional component in another additional layer. After forming the cavity, method 500 comprises embedding the electronic component in the cavity in the additional layer, at 522. Further, method 500 can optionally comprise embedding the additional component in the additional cavity. The additional component can be an electronic component or a dummy component to help mechanically balance the core. At 524, method 500 laminates a buildup film for incorporating metal-layer-1 and metal layer-4 above.

Continuing, at 526, method 500 comprises forming vias that extend to underlying metal layers and electrical pads of the electronic component. In some examples, the vias can be formed by laser. In other examples, the vias can be formed by mechanical drilling. Next, method 500 comprises, at 528, depositing metal to complete the vias. In various examples, the metal can be formed by electroplating or electroless plating. Further, method 500 performs patterning of metal layers, at 530. Referring to the examples above, a resist layer can be formed, exposed, and developed for metal layer-1 and metal layer-4. Method 500 then etches the exposed metal, and strips the dry film, at 532. Method 500 is illustrative. In other examples, one or more additional steps can be performed and/or one or more steps depicted can be omitted.

FIG. 6 illustrates a flow diagram illustrating another example method 600 for embedding an electronic component into a core of a substrate. Method 600 can be used to form core 106, core 200, and/or core 300, for example. Method 600 comprises, at 602, obtaining a center and an additional layer for the core. Each of the center and the additional layer comprises one or more plies. In some examples, method 600 comprises, at 604, obtaining a second additional layer for the core. The second additional layer can help to balance the core for mechanical rigidity. The term "obtaining" as used herein represents obtaining the core and the additional layer in any way, including constructing the core and/or the additional layer, and/or obtaining pre-fabricated core and/or additional layers. As such, obtaining the core and the additional layer can comprise forming the additional layer ply by ply on the core. Obtaining the core also can comprise forming the additional layer by combining plies to form the additional layer before attaching the additional layer to the core.

Method 600 further comprises, at 606, forming a cavity for an electronic component in at least one of the center or the additional layer. In some examples, forming the cavity for the electronic component comprises forming a cavity in the center of the core, at 608. Alternatively or additionally, forming the cavity for the electronic component can comprises forming a cavity in the additional layer of the core, at 610. In examples having the second additional layer, method 600 further comprises, at 612, forming an additional cavity for an additional component in the second additional layer. The additional component can comprise an electronic component, a dummy component, or another component. The dummy component can help to balance the core, such as for mechanical rigidity, for example. At 614, method 600 further comprises placing the electronic component in the cavity. In examples having the additional component, method 600 further comprises, at 616, placing the additional component in the additional cavity.

Method 600 further comprises, at 618, affixing the center and the additional layer together. In examples having the second additional layer, method 600 further comprises affixing the second additional layer on an opposite side of the center than the first additional layer, at 620. Optionally, method 600 further comprises, at 622, affixing one or more buildup layers to the core. Each buildup layer comprises a metal layer and a dielectric layer. In such a manner a substrate having a core with a center and one or more additional layers is formed. In other examples, 622 can be omitted, and thus a core with an embedded electronic component comprising a thickness less than the thickness of the core is formed.

A substrate comprising a core as disclosed herein can allow a core to have a thickness greater than a thickness of an electronic component. Further, such core thicknesses help to provide mechanical rigidity to the substrate to support larger areas of an IC die and/or the substrate, along with additional buildup layers in the substrate.

In some examples, the methods and processes described herein may be tied to a computing system of one or more computing devices. In particular, such methods and processes may be implemented as a computer-application program or service, an application-programming interface (API), a library, and/or other computer-program product.

Another example provides an electronic device, comprising a substrate comprising a core and one or more buildup layers coupled with the core, each buildup layer comprising a metal layer and a dielectric layer, the core comprising a center comprising a plurality of plies, an additional layer comprising one or more additional plies, an electronic component embedded in at least one of the center or the additional layer of the core, the electronic component comprising a thickness less than a thickness of the core, and an integrated circuit die coupled with the substrate and electrically connected to the electronic component. In some such examples, the electronic component alternately or additionally is embedded in the center of the core. In some such examples, the electronic component alternately or additionally is electrically connected to the one or more buildup layers using a via in the additional layer. In some such examples, the electronic component alternately or additionally is embedded in the additional layer of the core. In some such examples, the electronic component is a first electronic component, and the electronic device alternately or additionally comprises a second electronic component embedded in a second additional layer of the core. In some such examples, the second electronic component alternately or additionally is located on an opposite side of the center than the first electronic component. In some such examples, the electronic device alternately or additionally comprises a dummy component located on an opposite side of the center than the electronic component. In some such examples, the electronic component alternately or additionally comprises one or more of an integrated passive device, a multilayer ceramic capacitor, or a capacitive array.

Another example provides an electronic device, comprising a substrate comprising a core and one or more buildup layers coupled with the core, each buildup layer comprising a metal layer and a dielectric layer, the core comprising a center comprising a plurality of plies, and an additional layer coupled to the center, the additional layer comprising one or more additional plies, an electronic component embedded in the center, the electronic component comprising a thickness less than a thickness of the core, and an integrated circuit die coupled with the substrate and electrically connected to the electronic component. In some such examples, the additional layer is a first additional layer, and the electronic device alternately or additionally comprises a second additional layer coupled to a side of the center opposite of the first additional layer, the second additional layer comprising one or more additional plies. In some such examples, the electronic component alternately or additionally is thermally coupled to a surface of the substrate using one or more thermal vias. In some such examples, the electronic component alternately or additionally is electrically connected to the one or more of the buildup layers using a via through the additional layer. In some such examples, the electronic component alternately or additionally comprises one or more of an integrated passive device, a multilayer ceramic capacitor, or a capacitive array.

Another example provides an electronic device, comprising a substrate comprising a core and one or more buildup layers coupled with the core, each buildup layer comprising a metal layer and a dielectric layer, the core comprising a center comprising a plurality of plies, and an additional layer coupled to the center, the additional layer comprising one or more additional plies, an electronic component embedded in the additional layer, the electronic component comprising a thickness less than a thickness of the core, and an integrated circuit die coupled with the substrate and electrically connected to the electronic component. In some such examples, the additional layer is a first additional layer, and the electronic device alternately or additionally comprises a second additional layer coupled to a side of the center opposite of the first additional layer, the second additional layer comprising one or more additional plies. In some such examples, the electronic component is a first electronic component, and the electronic device alternately or additionally comprises a second electronic component embedded in the second additional layer of the core. In some such examples, the second electronic component alternately or additionally is located on an opposite side of the core than the first electronic component. In some such examples, the electronic device alternately or additionally comprises a dummy component located on an opposite side of the center than the electronic component. In some such examples, the electronic component alternately or additionally is aligned with a capture pad of the center of the core, and the capture pad is located between plated through hole vias in the center of the core. In some such examples, the electronic component alternately or additionally comprises one or more of an integrated passive device, a multilayer ceramic capacitor, or a capacitive array.

Another example provides a method for embedding an electronic component into a core of a substrate, the electronic component being a thickness less than a thickness of the core, the method comprising obtaining a center and an additional layer for the core, each of the center and the additional layer comprising one or more plies, forming a cavity for the electronic component in at least one of the center or the additional layer, placing the electronic component in the cavity, and affixing the center and the additional layer together. In some such examples, forming the cavity for the electronic component in at least one of the center or the additional layer alternately or additionally comprises forming the cavity in the center of the core. In some such examples, forming the cavity for the electronic component in at least one of the center or the additional layer alternately or additionally comprises forming the cavity in the additional layer of the core. In some such examples, the additional layer is a first additional layer, and the method alternately or additionally comprises affixing a second additional layer of the core to an opposite side of the center from the first additional layer. In some such examples, the method alternately or additionally comprises forming an additional cavity for an additional component in the second additional layer; and placing the additional component in the additional cavity. In some such examples, obtaining the core and the additional layer alternately or additionally comprises forming the additional layer ply by ply on the core. In some such examples, obtaining the core and the additional layer alternately or additionally comprises forming the additional layer by combining plies to form the additional layer before attaching the additional layer to the core.

It will be understood that the configurations and/or approaches described herein are exemplary in nature, and that these specific examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and non-obvious combinations and sub-combinations of the various processes, systems and configurations, and other features, functions, acts, and/or properties disclosed herein, as well as any and all equivalents thereof.

The invention claimed is:

1. An electronic device, comprising:
   a substrate comprising a core and one or more buildup layers coupled with the core, each buildup layer comprising a metal layer and a dielectric layer, the core comprising
   a center comprising a plurality of plies,
   an additional layer comprising one or more additional plies;
   an electronic component embedded in at least one of the center or the additional layer of the core and aligned with a capture pad of the center of the core, the capture pad being located between plated through hole vias in the center of the core, the electronic component comprising an integrated passive device and a thickness less than a thickness of the core; and
   an integrated circuit die coupled with the substrate and electrically connected to the electronic component.

2. The electronic device of claim 1, wherein the electronic component is embedded in the center of the core.

3. The electronic device of claim 2, wherein the electronic component is electrically connected to the one or more buildup layers using a via in the additional layer.

4. The electronic device of claim 1, wherein the electronic component is embedded in the additional layer of the core.

5. The electronic device of claim 4, wherein the electronic component is a first electronic component, and the electronic device further comprises a second electronic component embedded in a second additional layer of the core.

6. The electronic device of claim 5, wherein the second electronic component is located on an opposite side of the center than the first electronic component.

7. The electronic device of claim 4, further comprising a dummy component located on an opposite side of the center than the electronic component.

8. An electronic device, comprising:

a substrate comprising a core and one or more buildup layers coupled with the core, each buildup layer comprising a metal layer and a dielectric layer, the core comprising a center comprising a plurality of plies, and an additional layer coupled to the center, the additional layer comprising one or more additional plies;

an electronic component embedded in the center and aligned with a capture pad of the center of the core, the capture pad being located between plated through hole vias in the center of the core, the electronic component comprising an integrated passive device and a thickness less than a thickness of the core; and an integrated circuit die coupled with the substrate and electrically connected to the electronic component.

9. The electronic device of claim 8, wherein the additional layer is a first additional layer, and further comprising a second additional layer coupled to a side of the center opposite of the first additional layer, the second additional layer comprising one or more additional plies.

10. The electronic device of claim 9, wherein the electronic component is thermally coupled to a surface of the substrate using one or more thermal vias.

11. The electronic device of claim 8, wherein the electronic component is electrically connected to the one or more of the buildup layers using a via through the additional layer.

12. An electronic device, comprising:

a substrate comprising a core and one or more buildup layers coupled with the core, each buildup layer comprising a metal layer and a dielectric layer, the core comprising a center comprising a plurality of plies, plated through hole vias, and a capture pad located between the plated through hole vias, and an additional layer coupled to the center, the additional layer comprising one or more additional plies;

an electronic component embedded in the additional layer and aligned with the capture pad of the center of the core, the electronic component comprising a thickness less than a thickness of the core; and an integrated circuit die coupled with the substrate and electrically connected to the electronic component.

13. The electronic device of claim 12, wherein the additional layer is a first additional layer, and further comprising a second additional layer coupled to a side of the center opposite of the first additional layer, the second additional layer comprising one or more additional plies.

14. The electronic device of claim 13, wherein the electronic component is a first electronic component, and the electronic device further comprises a second electronic component embedded in the second additional layer of the core.

15. The electronic device of claim 14, wherein the second electronic component is located on an opposite side of the core than the first electronic component.

16. The electronic device of claim 13, further comprising a dummy component located on an opposite side of the center than the electronic component.

17. The electronic device of claim 12, wherein the electronic component comprises one or more of an integrated passive device, a multilayer ceramic capacitor, or a capacitive array.

* * * * *